United States Patent
Tsuno et al.

(10) Patent No.: US 10,861,732 B2
(45) Date of Patent: Dec. 8, 2020

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Masaya Tsuno, Nagano (JP); Tomotake Minemura, Nagano (JP); Shigeaki Suganuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 336 days.

(21) Appl. No.: 15/957,240

(22) Filed: Apr. 19, 2018

(65) Prior Publication Data

US 2018/0315634 A1 Nov. 1, 2018

(30) Foreign Application Priority Data

Apr. 27, 2017 (JP) ................. 2017-087910

(51) Int. Cl.
*H01L 21/687* (2006.01)
*H01L 21/683* (2006.01)
*H01J 37/32* (2006.01)

(52) U.S. Cl.
CPC .... *H01L 21/6833* (2013.01); *H01J 37/32724* (2013.01); *H01L 21/68757* (2013.01); *H01J 2237/334* (2013.01); *H01J 2237/3321* (2013.01)

(58) Field of Classification Search
CPC ............. H01L 21/6831; H01L 21/6833; H01L 21/68757; H01J 37/32724; H01J 2237/3321; H01J 2237/334

USPC ......................................................... 361/233
See application file for complete search history.

(56) References Cited

U.S. PATENT DOCUMENTS

| | | | |
|---|---|---|---|
| 6,383,964 B1 | 5/2002 | Nakahara et al. | |
| 2005/0215073 A1* | 9/2005 | Nakamura | H01L 21/6831 438/778 |
| 2006/0019817 A1* | 1/2006 | Kobayashi | C04B 41/009 501/98.5 |
| 2009/0273878 A1 | 11/2009 | Lee et al. | |
| 2010/0171044 A1 | 7/2010 | Lee et al. | |
| 2014/0177123 A1 | 6/2014 | Thach et al. | |
| 2014/0334059 A1* | 11/2014 | Miyazawa | H01L 21/68757 361/234 |
| 2016/0251265 A1* | 9/2016 | Takahashi | H05K 7/2039 361/234 |
| 2017/0057875 A1* | 3/2017 | Ishizuka | C04B 35/6261 |

FOREIGN PATENT DOCUMENTS

| | | |
|---|---|---|
| JP | 2000-191369 | 7/2000 |
| JP | 2011-519486 | 7/2011 |
| JP | 2016-503962 | 2/2016 |
| WO | 2014/084334 | 6/2014 |

\* cited by examiner

*Primary Examiner* — Alex Torres-Rivera
(74) *Attorney, Agent, or Firm* — Rankin, Hill & Clark LLP

(57) ABSTRACT

An electrostatic chuck includes: an insulating plate consisting of alumina, and YAG (Yttrium Aluminum Garnet) added with cerium, and configured to mount a substrate thereon; and an electrode which is embedded in the insulating plate and configured to generate electrostatic force for adsorbing the substrate.

5 Claims, 13 Drawing Sheets

FIRST COMPARATIVE EXAMPLE

PRESENT EMBODIMENT

ELECTROSTATIC CHUCK AND SUBSTRATE FIXING DEVICE

This application claims priority from Japanese Patent Application No. 2017-087910, filed on Apr. 27, 2017, the entire contents of which are herein incorporated by reference.

BACKGROUND

Technical Field

The present disclosure relates to an electrostatic chuck and a substrate fixing device.

Background Art

Various processes such as plasma etching and CVD (Chemical Vapor Deposition) are applied to a substrate such as a silicon wafer. In this manner, a semiconductor device such as an LSI (Large Scale integration) is manufactured.

These processes are performed inside a chamber while the substrate is fixed by an electrostatic chuck. The electrostatic chuck is a device which adsorbs the substrate by electrostatic force. Since the electrostatic chuck can generate the electrostatic force in a simple structure, the electrostatic chuck is widely spread. For example, the following documents disclose an electrostatic chuck for absorbing a substrate by electrostatic force:

[PTL 1] JP-A-2011-519486
[PTL 2] JP-A-2016-503962
[PTL 3] WO 2014/084334
[PTL 4] JP-A-2000-191369

However, the processes such as plasma etching and CVD are performed on the substrate while the substrate is heated. Therefore, when adsorptive force of the electrostatic chuck is lowered during the heating, there is a fear that the substrate may be detached from the electrostatic chuck to thereby result in a decrease in a yield of the semiconductor device.

SUMMARY

According to one aspect, an object of the present disclosure is to provide an electrostatic chuck whose adsorptive force is hardly lowered even during heating, and a substrate fixing device.

According to one or more aspects of the present disclosure, there is provided an electrostatic chuck.

The electrostatic chuck comprises:

an insulating plate consisting of alumina, and YAG (Yttrium Aluminum Garnet) added with cerium, and configured to mount a substrate thereon; and an electrode which is embedded in the insulating plate and configured to generate electrostatic force for adsorbing the substrate.

According to the one aspect, the insulating plate consists of the alumina, and the YAG added with the cerium. In this manner, the volume resistivity of the insulating plate can be suppressed from being lowered even when the insulating plate is heated. As a result, the volume resistivity of the insulating plate can be maintained at a high value. Accordingly, electric charges generated in the electrode hardly leak to the insulating plate, and adsorptive force of the electrostatic chuck is hardly lowered even when the electrostatic chuck is heated.

DETAILED DESCRIPTION

An embodiment of the invention will be described below in detail with reference to the accompanying drawings.

Figure 1:
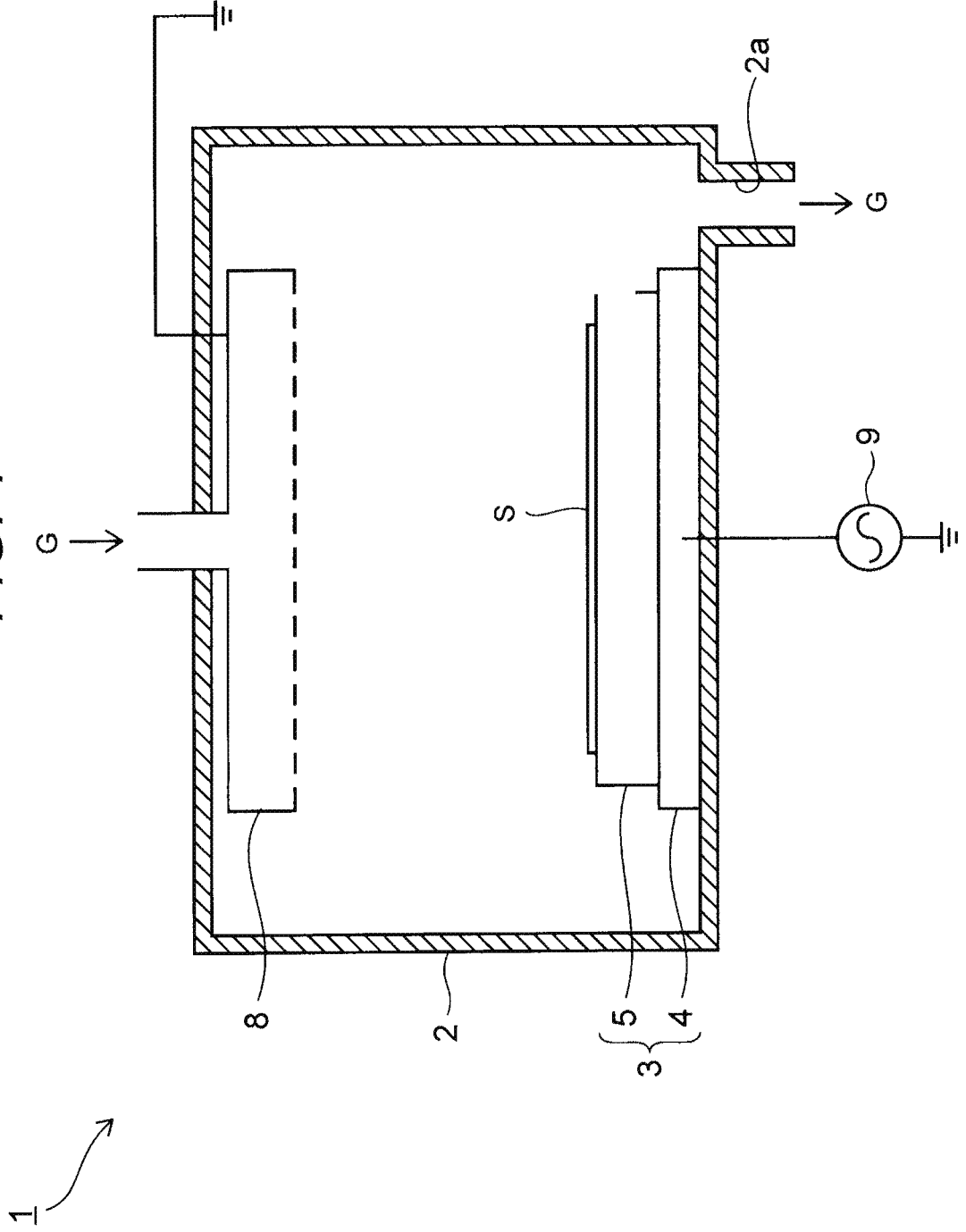
FIG. 1 is a sectional view of a semiconductor manufacturing apparatus according to an embodiment of the invention.

FIG. 1 is a sectional view of a semiconductor manufacturing apparatus according to the embodiment.

For example, the semiconductor manufacturing apparatus 1 is a plasma etching apparatus. The semiconductor manufacturing apparatus 1 includes a chamber 2 and a substrate fixing device 3 disposed in the chamber 2.

The substrate fixing device 3 is a device which fixes a substrate S inside the chamber 2. The substrate fixing device 3 includes a base plate 4, and an electrostatic chuck 5 fixed on the base plate 4.

Of the substrate fixing device 3, the base plate 4 is an electrically conductive plate also serving as a lower electrode. The base plate 4 is fixed to a bottom portion of the chamber 2 by not-shown screws. In this example, an aluminum plate is used as the base plate 4, and a high-frequency power supply 9 is connected to the base plate 4.

On the other hand, the electrostatic chuck 5 adsorbs the substrate S by electrostatic force. Thus, the electrostatic chuck 5 fixes the substrate S inside the chamber 2. For example, a semiconductor substrate such as a silicon wafer may be used as the substrate S to be fixed.

In addition, an upper electrode 8 is provided at an upper portion of the chamber 2 to face the substrate fixing device 3. The upper electrode 8 serves as a shower head for supplying etching gas G inside the chamber 2.

Further, an outlet 2a is provided at a lower portion of the chamber 2. The etching gas G can be discharged from the outlet 2a.

In practical use, high-frequency electric power is applied to the base plate 4 from the high-frequency power supply 9 while the upper electrode 8 is maintained at a ground potential. Thus, the etching gas G is turned into plasma. As a result, the substrate S is etched.

Figure 2:
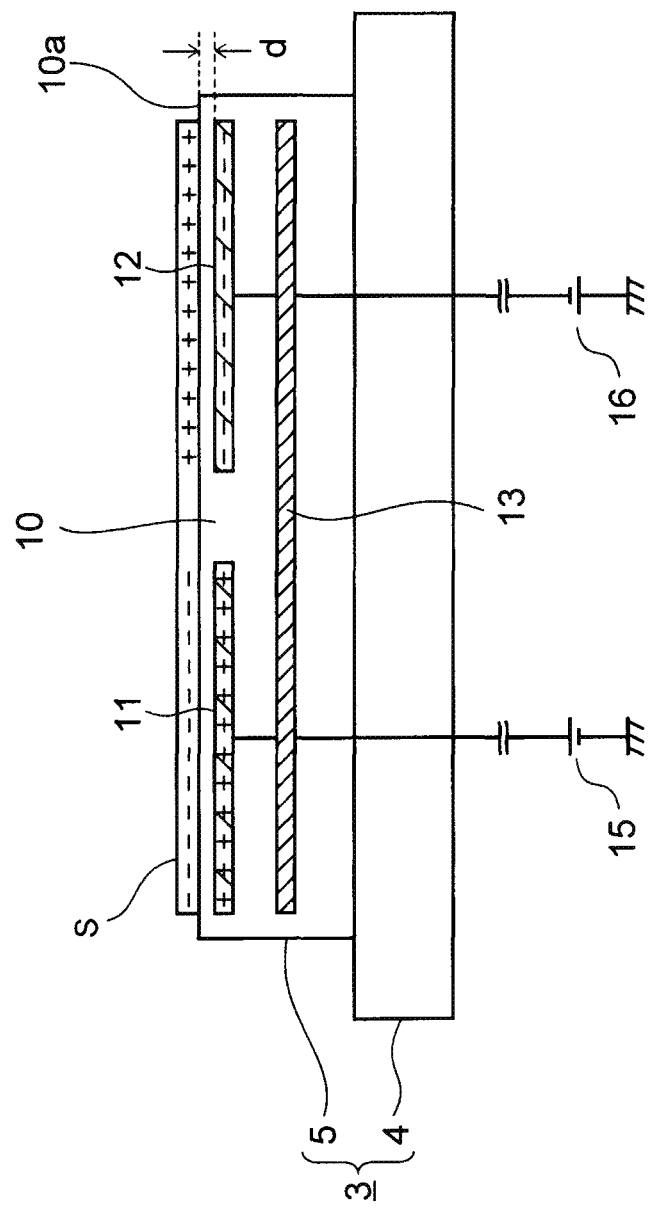
FIG. 2 is a sectional view of a substrate fixing device according to the embodiment.

FIG. 2 is a sectional view of the aforementioned substrate fixing device 3.

As shown in FIG. 2, the electrostatic chuck 5 includes an insulating plate 10 on which the substrate S is mounted.

The insulating plate 10 is a ceramics plate which is hardly corroded by the etching gas. First and second electrodes 11 and 12 and a heater 13 are embedded in the insulating plate 10. The first electrode 11 and the second electrode 12 may be hereinafter simply referred to as electrodes 11 and 12 for convenience of explanation.

Of the insulating plate 10, a positive voltage of a first DC power supply 15 is applied to the first electrode 11, and a negative voltage of a second DC power supply 16 is applied to the second electrode 12.

Thus, positive and negative electric charges are generated in the first electrode 11 and the second electrode 12 respectively. At the same time, electric charges opposite in polarity to the generated electric charges are induced in a back surface of the substrate S, so that coulomb force for adsorbing the substrate S is generated in each electrode 11, 12. The electrostatic chuck using such coulomb force as electrostatic force for adsorbing the substrate S is also referred to as coulomb type electrostatic chuck.

Incidentally, it is preferable that a distanced between an upper surface 10a of the insulating plate 10 and the electrode 11, 12 is made as narrow as possible in order to increase the electrostatic force for adsorbing the substrate S. In this example, the distance d is set at several ten μm to several hundred μm.

In addition, the heater 13 is a resistance heating type heater which generates heat due to currents supplied from the first power supply 15 and the second power supply 16. During plasma etching, the substrate S is heated at room temperature to a temperature of about 200° C.

Figure 3:
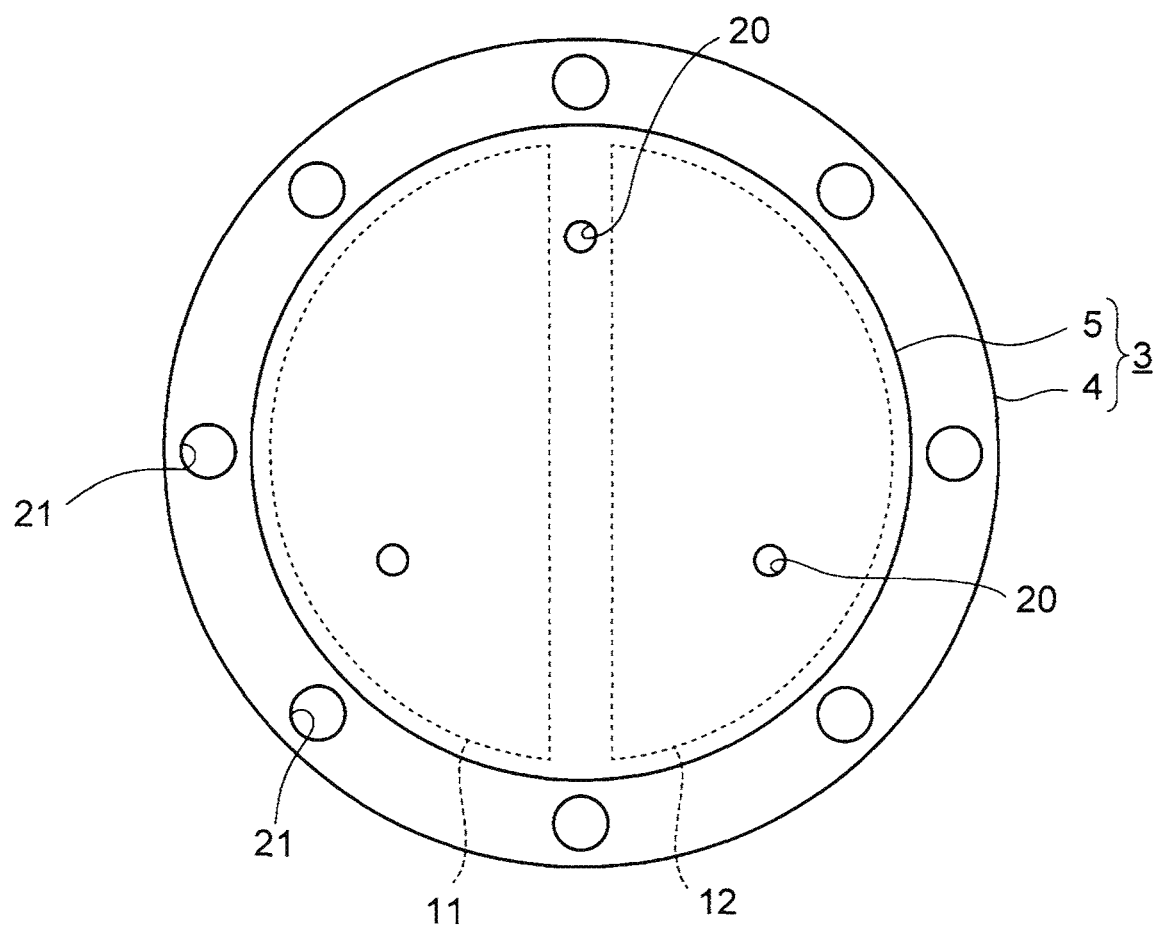
FIG. 3 is a plan view of the substrate fixing device according to the embodiment.

FIG. 3 is a plan view of the substrate fixing device 3.

As shown in FIG. 3, each of the base plate 4 and the electrostatic chuck 5 is circular in plan view. The diameters of the base plate 4 and the electrostatic chuck 5 are not limited particularly. The diameter of the base plate 4 is about 113 mm to 472 mm. The diameter of the electrostatic chuck 5 is about 101 mm to 460 mm.

In addition, holes 20 which are penetrated by not-shown lift pins for lifting up the substrate S are provided in each of the base plate 4 and the electrostatic chuck 5.

Further, screw holes 21 for fixing the base plate 4 to the bottom portion of the chamber 2 are also provided in the base plate 4.

Next, a method for manufacturing the aforementioned electrostatic chuck 5 will be described.

Figure 4A:
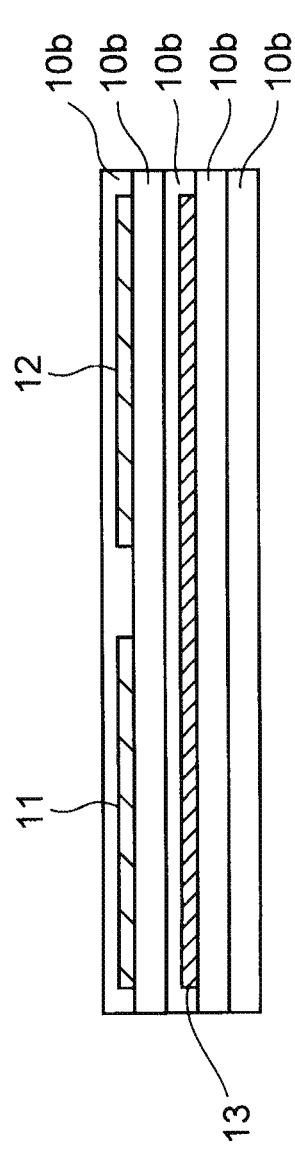
FIGS. 4A and 4B are sectional views for explaining a process of manufacturing an electrostatic chuck according to the embodiment.
Figure 4B:
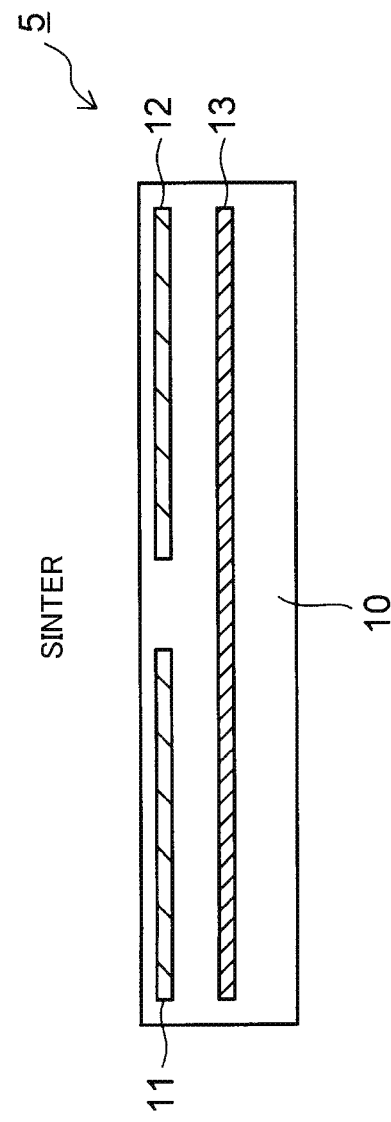

FIGS. 4A and 4B are sectional views for explaining a process of manufacturing the electrostatic chuck 5 according to the embodiment.

First, as shown in FIG. 4A, a plurality of sheets 10b are layered on top of one another. Each of the sheets 10b is made of powder of alumina ($Al_2O_3$), powder of yttria ($Y_2O_3$) and powder of cerium dioxide ($CeO_2$) and has a thickness of about 0.5 mm to 0.6 mm.

Concentrations of the respective components in the sheet 10b are not limited particularly. When molar concentration of the alumina and molar concentration of the yttria in the sheet 10b are expressed as X mol % and (100-X) mol %, X falls into a range of from 80 to 90 according to the embodiment.

In addition, molar concentration of the cerium dioxide in the sheet 10b is 0.5 mol % to 1 mol %. In this case, molar concentration of the cerium alone in the sheet 10b is 0.4 mol % to 0.8 mol %.

Incidentally, a metal paste of tungsten etc. is printed as each electrode 11, 12 or the heater 13 in advance in a layer between adjacent ones of the plurality of sheets 10b.

Further, the number of the layered sheets 10b is also not limited particularly. For example, five to several ten sheets 10b may be layered.

Next, the plurality of sheets 10b are heated at a temperature of about 1,500° C., as shown in FIG. 4B. When this state is retained for several hours, each of the sheets 10b is sintered. An assembly of the layered sheets 10b is formed as an insulating plate 10.

YAG (Yttrium Aluminum Garnet: $Y_3Al_5O_{12}$) in addition to alumina is produced in the sintered insulating plate 10, as will be described later. Concentration of the YAG in the insulating plate 10 is 35 wt % while concentration of the alumina in the insulating plate 10 is 65 wt %.

Further, the concentration of the cerium alone does not change before and after the sintering. Therefore, the concentration of the cerium in the insulating plate 10 is 0.4 mol % to 0.8 mol % which is the same as that in the sheet 10b prior to the sintering.

Incidentally, in order to prevent electric conductivity from being lost due to oxidization of the tungsten contained in the electrode 11, 12 or the heater 13, it is preferable that the sintering in this step is performed in a deoxidized atmosphere from which oxygen has been removed. For example, an atmosphere composed of only nitrogen and hydrogen may be used as such a deoxidized atmosphere.

In the aforementioned manner, the basic structure of the electrostatic chuck 5 according to the embodiment is completed.

According to the aforementioned embodiment, only the alumina, the yttria and the cerium dioxide are used as materials of the insulating plate 10, as described above. The present inventor conducted various examinations about the insulating plate 10 obtained thus. The examinations will be described below.

About Crystal Phases

The present inventor examined what kinds of crystal phases were contained in the insulating plate 10 by XRD (X-Ray Diffraction).

Figure 5:
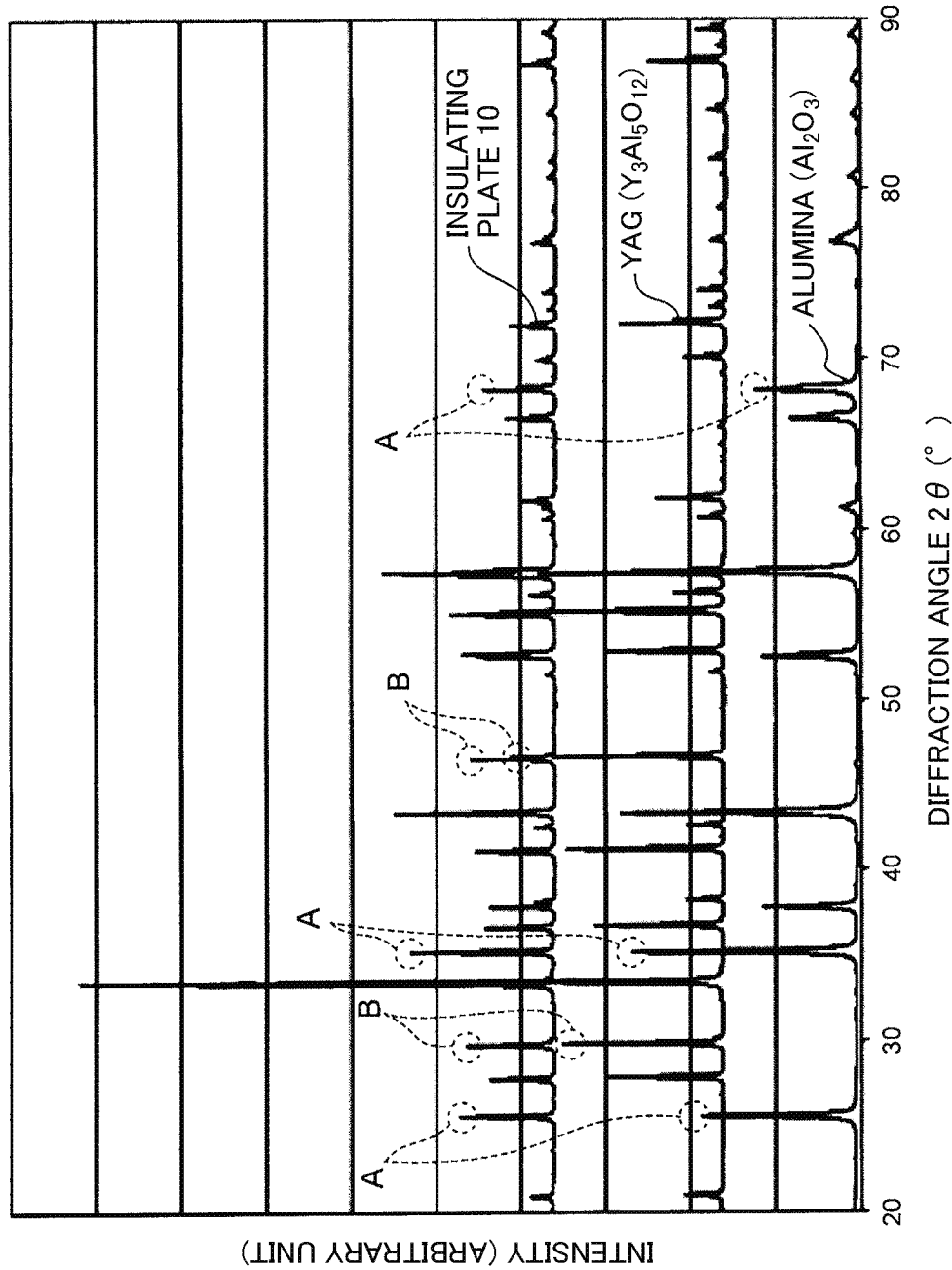
FIG. 5 is a diagram showing examination results of crystal phases included in an insulating plate according to the embodiment.

Results of the examination are shown in FIG. 5.

FIG. 5, an abscissa indicates diffraction angle (2θ) of X-rays, and an ordinate indicates intensity of diffracted X-rays.

In this examination, respective intensity profiles of the diffracted X-rays in alumina crystal, YAG crystal and the insulating plate 10 were examined. Incidentally, in FIG. 5, these intensity profiles are illustrated to be separated vertically so as not to overlap with one another.

As shown in FIG. 5, both a peak A of the alumina crystal and a peak B of the YAG crystal appear in the intensity profile of the insulating plate 10. On the other hand, neither a peak of an yttrium ingot nor a peak of a cerium ingot appears in the intensity profile of the insulating plate 10.

The results reveal that the yttrium ingot and the cerium ingot are not contained in the insulating plate 10, but the insulating plate 10 consists of the alumina crystal and the YAG crystal.

About Element Distributions

The present inventor examined distributions of the respective elements in the insulating plate 10 by an SEM/EDX (Scanning Electron Microscope/Energy Dispersive X-ray Spectroscopy) method.

Results of the examination are shown in FIGS. 6A to 6D.

Of FIGS. 6A to 6D, FIG. 6A is an SEM image of a front surface of the insulating plate 10.

Figure 6:
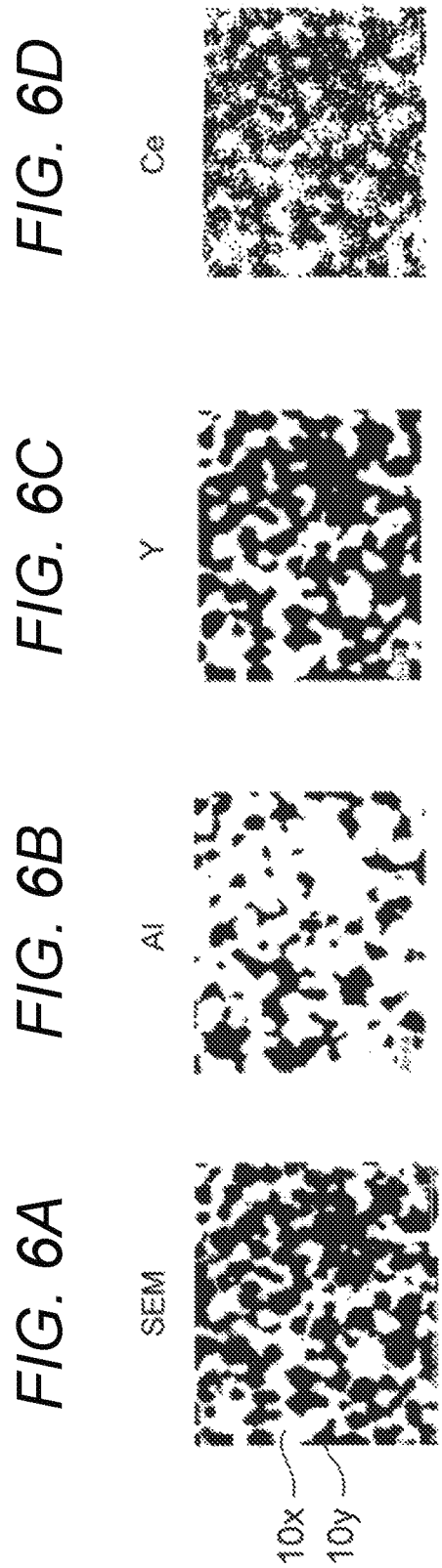
FIGS. 6A to 6D are views showing examination results of distributions of respective elements in the insulating plate according to the embodiment.

As shown in FIG. 6A, a bright portion 10x and a dark portion 10y appear in the SEM image of the insulating plate 10.

On the other hand, FIG. 6B is an image in which a distribution of aluminum at the same place as in FIG. 6A is observed by EDX.

The aluminum is present in a region which looks bright in FIG. 6B. When this region and the dark portion 10y of FIG. 6A are compared with each other, the distributions of the both agree with each other. From this fact, it can be known that the dark portion 10y of FIG. 6A is the alumina crystal.

FIG. 6C is an image in which a distribution of yttrium at the same place as in FIG. 6A is observed by EDX.

The yttrium is present in a region which looks bright in FIG. 6C. When this region and the bright portion 10x of FIG. 6A are compared with each other, the distributions of the both are coincident with each other. From this fact, it can be known that the bright portion 10x of FIG. 6A is the YAG crystal.

FIG. 6D is an image in which a distribution of cerium at the same place as in FIG. 6A is observed by EDX.

The cerium is present in a bright region of FIG. 6D. However, the distribution of this region is coincident with the distribution of the bright portion 10x of FIG. 6A. Since the bright portion 10x represents the YAG crystal as described above, the result also reveals that the cerium is added to the YAG crystal.

Incidentally, the cerium is absent from a dark region of FIG. 6D. The distribution of this region is coincident with the distribution of the dark portion 10y of FIG. 6A. Therefore, it can be also known that the cerium is not added to the alumina crystal.

The aforementioned results reveal that the insulating plate 10 consists of the alumina crystal, and the YAG crystal added with the cerium.

About Temperature Dependency of Volume Resistivity

The present inventor examined how the volume resistivity of the insulating substrate 10 is varied due to temperature.

Figure 7:
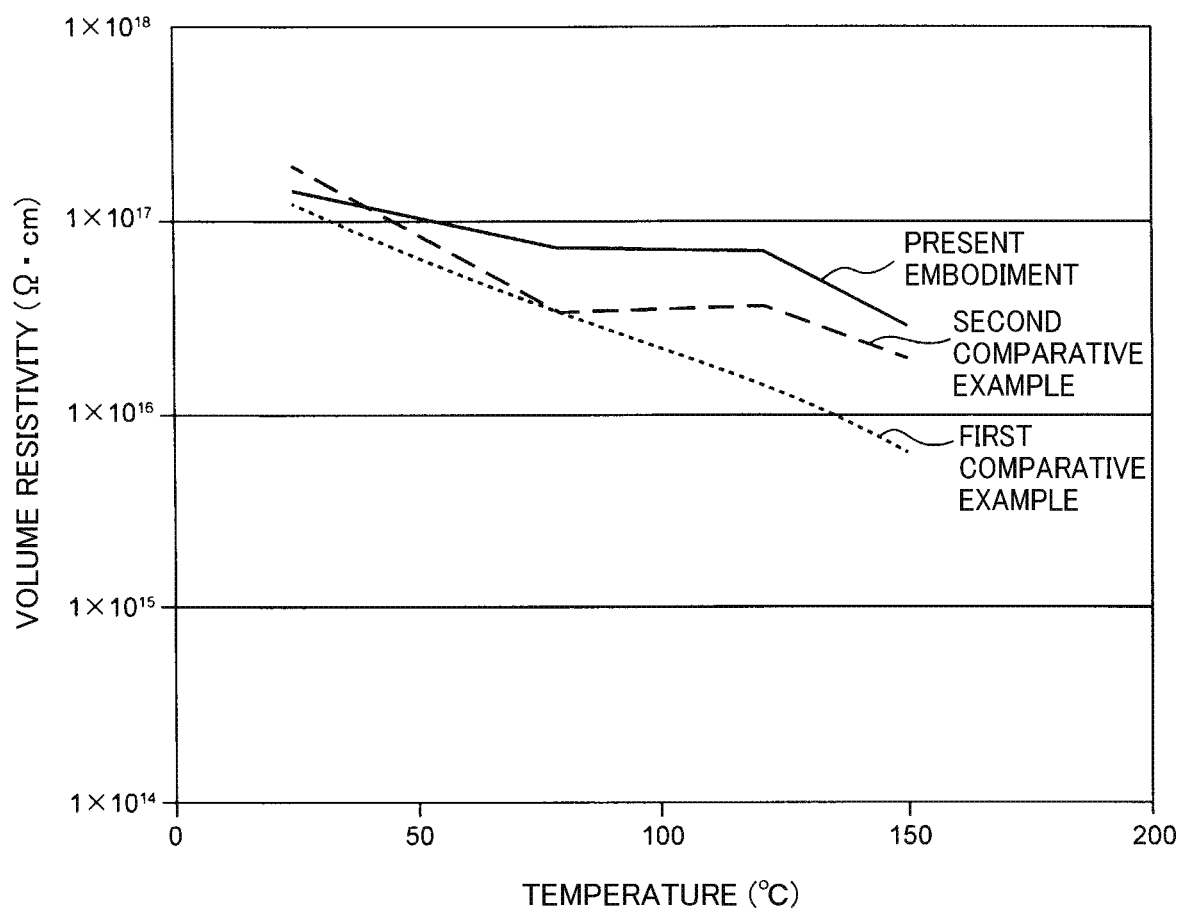
FIG. 7 is a graph showing an examination result about how the volume resistivity of the insulating plate according to the embodiment is varied due to temperature.

A result of the examination is shown in FIG. 7.

In FIG. 7, an abscissa indicates temperature of the insulating plate 10, and an ordinate indicates the volume resistivity of the insulating plate 10.

Incidentally, in the examination, volume resistivities of insulating plates 10 according to a first comparative example and a second comparative example in addition to the insulating plate 10 according to the embodiment were also examined.

Of these insulating plates 10, the insulating plate 10 according to the first comparative example is a ceramics plate in which powder of alumina ($Al_2O_3$), powder of magnesium oxide (MgO), powder of calcium oxide (CaO), powder of silicon dioxide ($SiO_2$), and powder of yttria ($Y_2O_3$) are mixed and sintered.

On the other hand, the insulating plate 10 according to the second comparative example is a ceramics plate in which alumina and yttria are mixed and sintered to have the same molar concentrations as those in the embodiment respectively. Differently from the embodiment, the cerium is however not added into the ceramics plate according to the second comparative example.

As shown in FIG. 7, in the first comparative example, the volume resistivity decreases as the temperature increases.

When the volume resistivity decreases in this manner, electric charges are apt to flow through the insulating plate 10. Accordingly, electric charges in each electrode 11, 12 (see FIG. 2) escape to the outside through the insulating plate 10 so that adsorptive force for adsorbing a substrate S decreases.

Particularly, plasma etching or CVD etc. for manufacturing a semiconductor device is performed on the substrate S while the substrate S is heated at a temperature not lower than room temperature. Accordingly, when the adsorptive force of the insulating plate 10 is lowered during the heating, the substrate S is detached from the electrostatic chuck 5 to thereby result in a decrease in a yield of the semiconductor device.

In order to prevent the substrate S from being detached, it is desirable that the insulating plate 10 practically has the volume resistivity of $1 \times 10^{16}$ Ω·cm or higher. In the first comparative example, the volume resistivity is lower than $1 \times 10^{16}$ Ω·cm at a temperature lower than 150° C.

On the other hand, in the second comparative example, a decrease in the volume resistivity is suppressed more greatly than that in the first comparative example. However, when the temperature reaches 150° C., the volume resistivity approaches $1 \times 10^{16}$ Ω·cm.

In contrast, in the embodiment, a decrease in the volume resistivity when the temperature increases is suppressed more greatly than that in each of the first comparative example and the second comparative example. Even when the temperature is 150° C., the volume resistivity of the insulating plate 10 sufficiently exceeds $1 \times 10^{16}$ Ω·cm which is large enough to withstand practical use.

Particularly, the volume resistivity according to the embodiment is higher than the volume resistivity according to the second comparative example in which no cerium is added into the insulating plate 10. Therefore, this fact reveals that the addition of the cerium is effective in suppressing the volume resistivity from decreasing with an increase in the temperature.

In addition, the volume resistivity according to the embodiment is higher than the volume resistivity according to the first comparative example for the following reason.

Figure 8B:
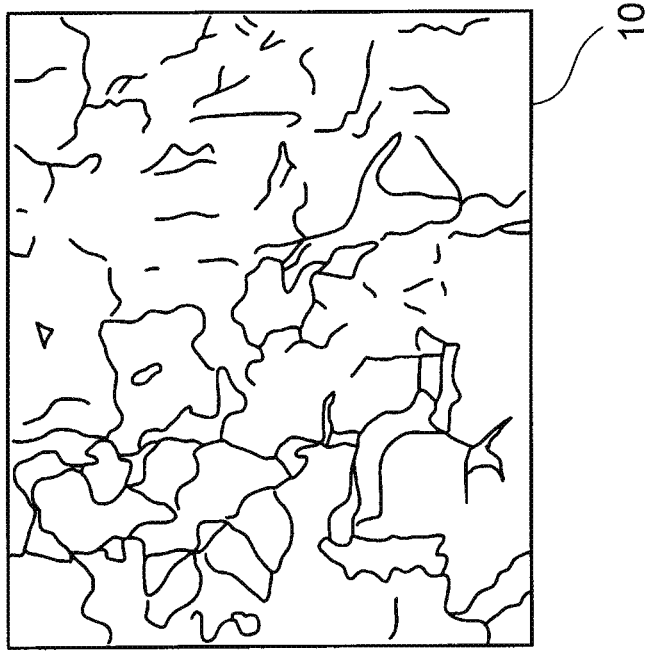
FIGS. 8A and 8B are views showing a reason why the volume resistivity of the insulating plate according to the embodiment is increased.
Figure 8A:
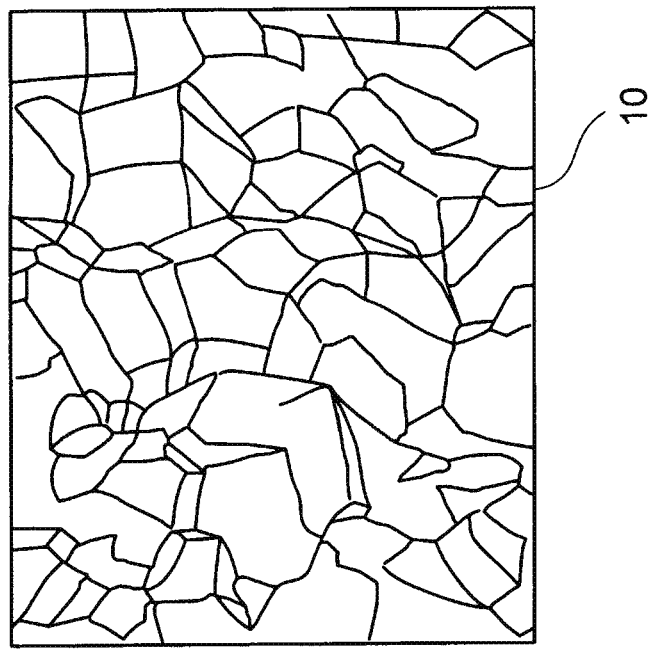

FIGS. 8A and 8B are schematic views for explaining the reason.

Of FIGS. 8A and 8B, FIG. 8A is a view illustrated based on an SEM image of a fracture surface of the insulating plate 10 according to the embodiment.

As shown in FIG. 8A, crystal grains of the alumina and crystal grains of the YAG appear clearly in the fracture surface in the embodiment. An amorphous material is absent from grain boundaries between these crystal grains.

On the other hand, FIG. 8B is a view illustrated based on an SEM image of a fracture surface of the insulating plate 10 according to the first comparative example.

As shown in FIG. 8B, the silicon dioxide is added into the insulating plate 10 in the first comparative example. Accordingly, crystal grains in the fracture surface are covered with the amorphous silicon dioxide. The amorphous silicon dioxide is smaller in volume resistivity than the alumina crystal or the YAG crystal to thereby cause a decrease in the volume resistivity of the insulating plate 10 at high temperature.

In the embodiment, the decrease in the volume resistivity is suppressed more greatly than that in the first comparative example as shown in FIG. 7, because amorphous material such as the silicon dioxide is absent from the grain boundaries between crystal grains of the alumina or the YAG in the insulating plate 10 according to the embodiment.

About Easiness of Removal of Substrate S

After the processes such as plasma etching and CVD on the substrate S are completed, application of a voltage to each electrode 11, 12 (see FIG. 2) is stopped. Thus, the substrate S can be removed from the insulating plate 10. On this occasion, in order to perform a next process on the substrate S quickly, it is preferable that the substrate S can be removed easily from the insulating plate 10.

Therefore, the present inventor examined easiness of the removal of the substrate S as follows.

Figure 9:
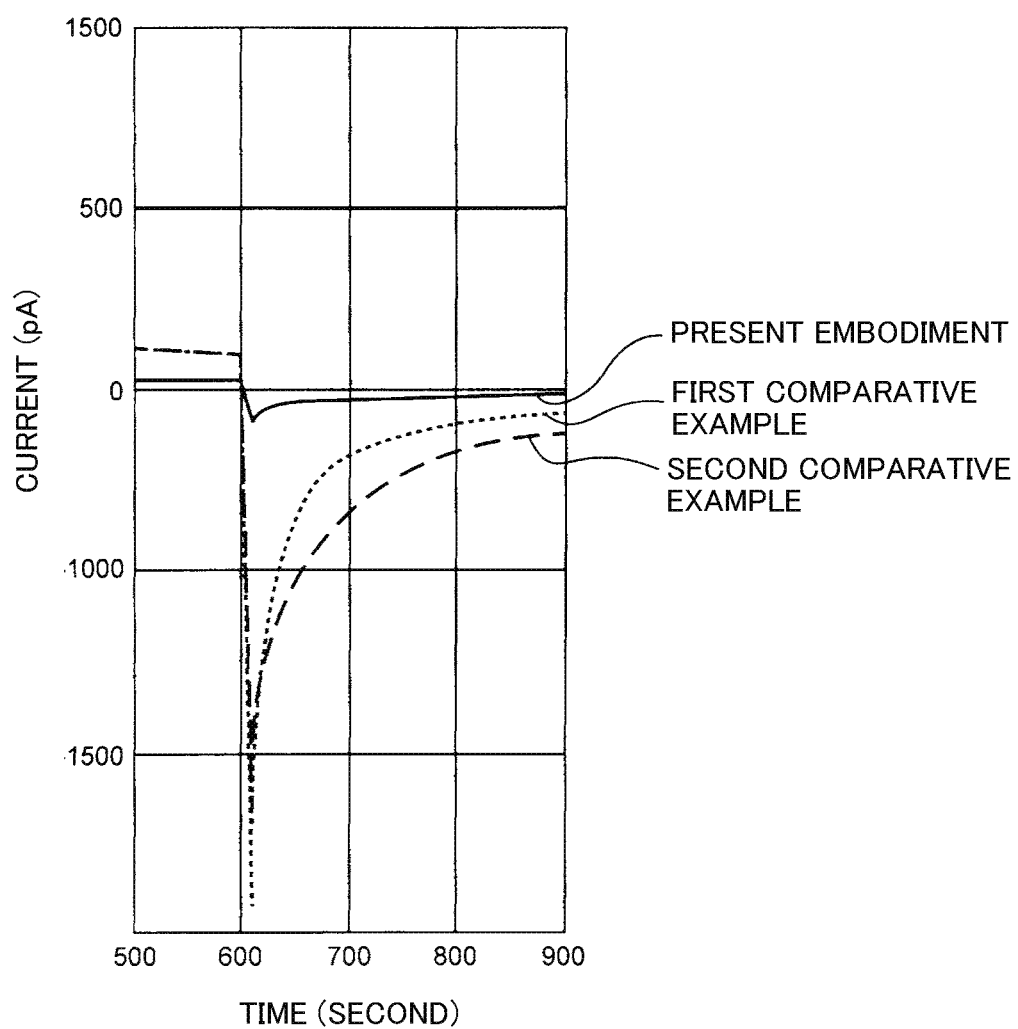
FIG. 9 is a graph showing an examination result about easiness of removal of the substrate in the embodiment.

FIG. 9 is a graph showing results of the examination.

In the examination, after the application of the voltage to the electrode 11, 12 was stopped, a current flowing between the front surface of the insulating plate 10 and the electrode 11, 12 was measured.

In FIG. 9, an abscissa indicates time, and an ordinate indicates the aforementioned current. Incidentally, a time for which the application of the voltage to the electrode 11, 12 was stopped is 60 seconds.

Further, in the examination, currents flowing through the respective insulating plates 10 according to the first comparative example and the second comparative example described in FIG. 7, in addition to the insulating plate 10 according to the embodiment, were also examined.

As shown in FIG. 9, in the first comparative example, after the application of the voltage to the electrode 11, 12 was stopped, a large current flowed, and it took a certain time until the current was attenuated. The current flowed due to electric charges remaining in the insulating plate 10. Therefore, in the first comparative example, even after the application of the voltage to the electrode 11, 12 was stopped, the electric charges are remained in the insulating plate 10, and electrostatic force for adsorbing the substrate S is still remained.

In a similar manner or the same manner, also in the second comparative example in which cerium was removed from the insulating plate 10 according to the embodiment, it took a long time until the current was attenuated.

In contrast, in the embodiment, the current was attenuated quickly after the application of the voltage to the electrode 11, 12 was stopped.

The results reveal that due to the cerium added to the YAG crystal of the insulating plate 10 as in the embodiment, electrostatic force acting from the insulating plate 10 onto the substrate S can be attenuated quickly so that the substrate S can be removed from the insulating plate 10 easily.

Preferred Cerium Concentration

As shown in FIG. 7, the cerium is effective in suppressing the volume resistivity of the insulating plate 10 from decreasing with an increase in the temperature. In addition, as shown in FIG. 9, the cerium is also effective in making it easy to remove the substrate S from the insulating plate 10.

The present inventor examined the desired concentration with which the cerium should be added into the insulating plate 10, from a different viewpoint from these effects. Results of the examination are shown in FIG. 10.

Figure 10:
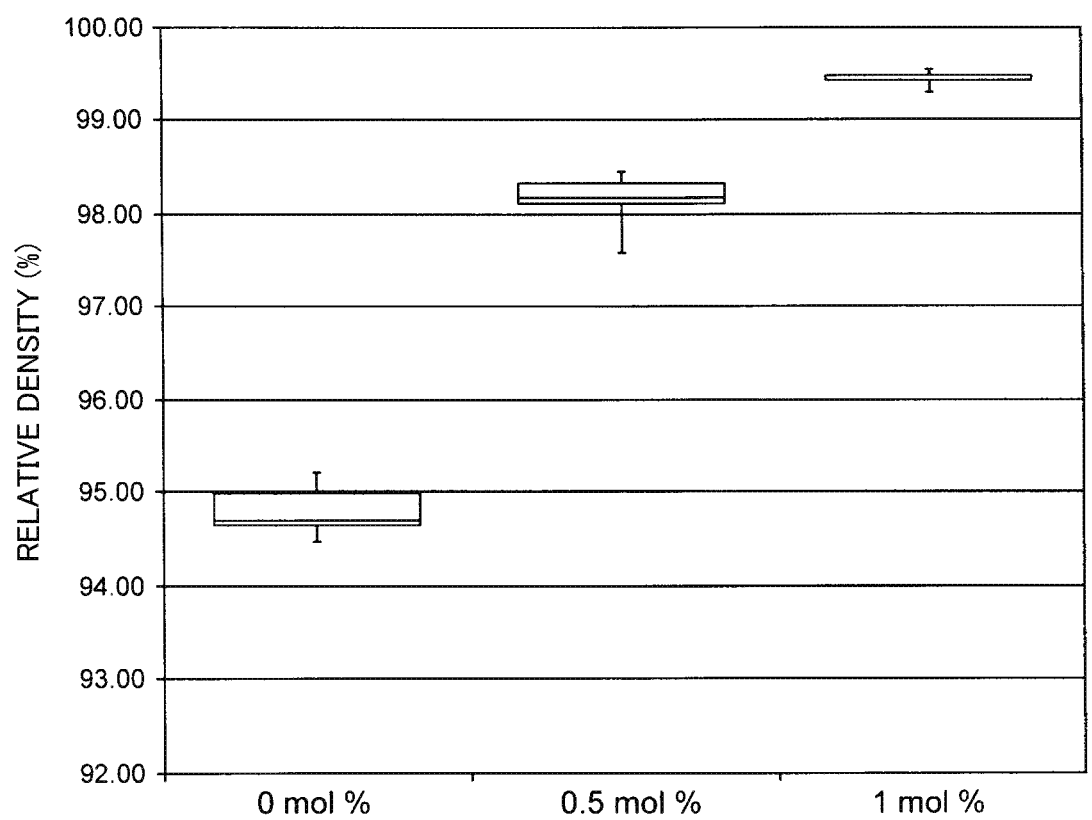
FIG. 10 is a diagram obtained by examining how relative density of the sintered insulating plate is varied due to molar concentration of cerium dioxide.

FIG. 10 is a diagram obtained by examining how relative density of the sintered insulating plate 10 is varied due to the molar concentration of the cerium dioxide added into each of the sheets 10b (see FIG. 4A).

Incidentally, the relative density is defined as a percentage for a ratio of density of the actually produced insulating plate 10 to density of an ideal insulating plate 10 having no hole.

Further, in this examination, samples for each of cases where concentrations of the cerium dioxide were 0 mol %, 0.5 mol % and 1 mol % were produced. The relative densities of the samples are shown in a box-and-whisker diagram as in FIG. 10.

As shown in FIG. 10, an average value of the relative densities in the samples containing no cerium, i.e. containing 0 mol % cerium was lower than 95%, whereas an average value of the relative densities in the samples containing 0.5 mol % cerium was increased to be higher than 98%. The results reveal that the cerium also has a function of increasing the relative density of the insulating plate 10.

In order to generate adsorptive force large enough for practical use in the insulating plate 10, it is preferable that the relative density of the insulating plate 10 is not lower than 95%. According to FIG. 10, when the concentration of the cerium dioxide is not lower than 0.5 mol %, the relative density can be increased to be not lower than 95%. Particularly, when the concentration of the cerium dioxide is 1 mol %, the relative density of the insulating plate 10 can be increased to approach 100%.

Incidentally, when the concentration of the cerium dioxide is 0.5 mol %, concentration of the cerium alone contained in the insulating plate 10 is 0.4 mol %. Accordingly, as long as the concentration of the cerium in the insulating plate 10 is not lower than 0.4 mol %, the relative density of the insulating plate 10 can be increased to be not lower than 95%, which is high enough for practical use, as described above.

Figure 11:
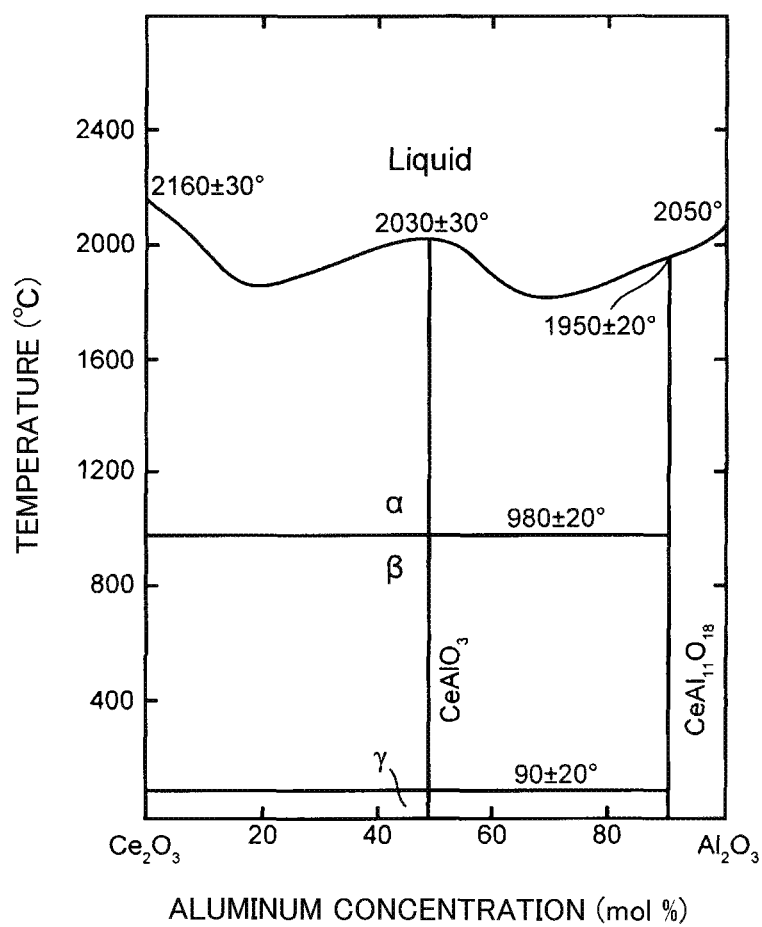
FIG. 11 is a state graph of a Ce—Al—O system.

On the other hand, FIG. 11 is a state graph of a Ce—Al—O system. Incidentally, in FIG. 11, an abscissa indicates concentration (mol %) of aluminum in the Ce—Al—O system.

As shown in FIG. 11, when the concentration of the aluminum is reduced to about 90 mol % and concentration of cerium is relatively increased to about 10 mol %, a cerium compound such as $CeAl_{11}O_{18}$ is produced.

When the cerium is consumed thus for the production of the cerium compound, it is difficult to add the cerium to YAG crystal. As a result, it is difficult to obtain various effects which can be obtained due to the cerium, such as suppression of resistance reduction (FIG. 7), quick attenuation of electrostatic force (FIG. 9), and high relative density (FIG. 10).

Therefore, it is preferable that an upper limit of the concentration of the cerium dioxide in the sheet 10b prior to sintering is set to be not higher than 1 mol % as in the examination in FIG. 10. Thus, the aforementioned various effects can be obtained surely. Incidentally, when the concentration of the cerium dioxide is 1 mol %, the concentration of the cerium alone contained in the insulating plate 10 is 0.8 mol %. Accordingly, since the concentration of the cerium in the insulating plate 10 is not higher than 0.8 mol %, it is easy to obtain the aforementioned various effects shown in FIG. 7, FIG. 9 and FIG. 10.

According to the aforementioned embodiment, the insulating plate 10 is composed of only the alumina, and the YAG added with the cerium. Thus, as shown in FIG. 7, the volume resistivity of the insulating plate 10 can be suppressed from being lowered even when the insulating plate is heated. As a result, the volume resistivity of the insulating plate 10 can be maintained at a high value. Accordingly, electric charges generated in each electrode 11, 12 (see FIG. 2) hardly leaks to the insulating plate 10. Thus, the adsorptive force of the electrostatic chuck 5 is hardly lowered even when the electrostatic chuck 5 is heated.

(Modifications)

In the aforementioned embodiment, the heater 13 for heating the substrate S is embedded in the insulating plate 10, as shown in FIG. 2. The place where the heater 13 is provided is not limited to the aforementioned one. Alternatively, the heater 13 may be provided as follows.

Figure 12:
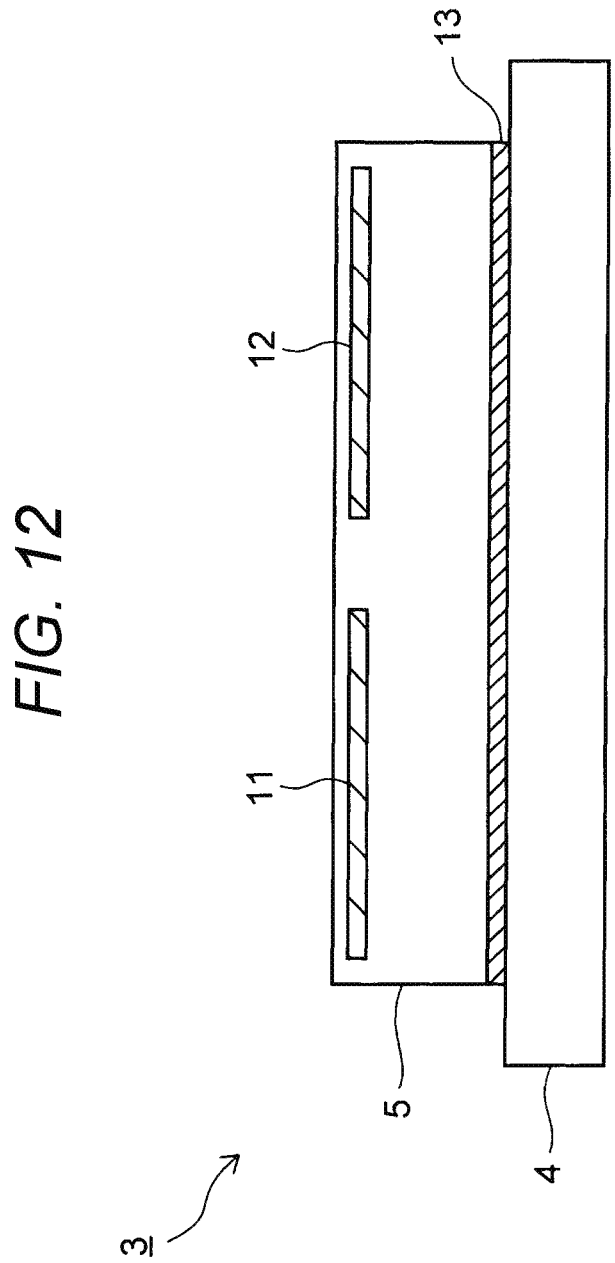
FIG. 12 is a sectional view of a substrate fixing device according to a first modification.

FIG. 12 is a sectional view of a substrate fixing device 3 according to a first modification.

In this example, a heater 13 is provided between a base plate 4 and an electrostatic chuck 5.

Figure 13:
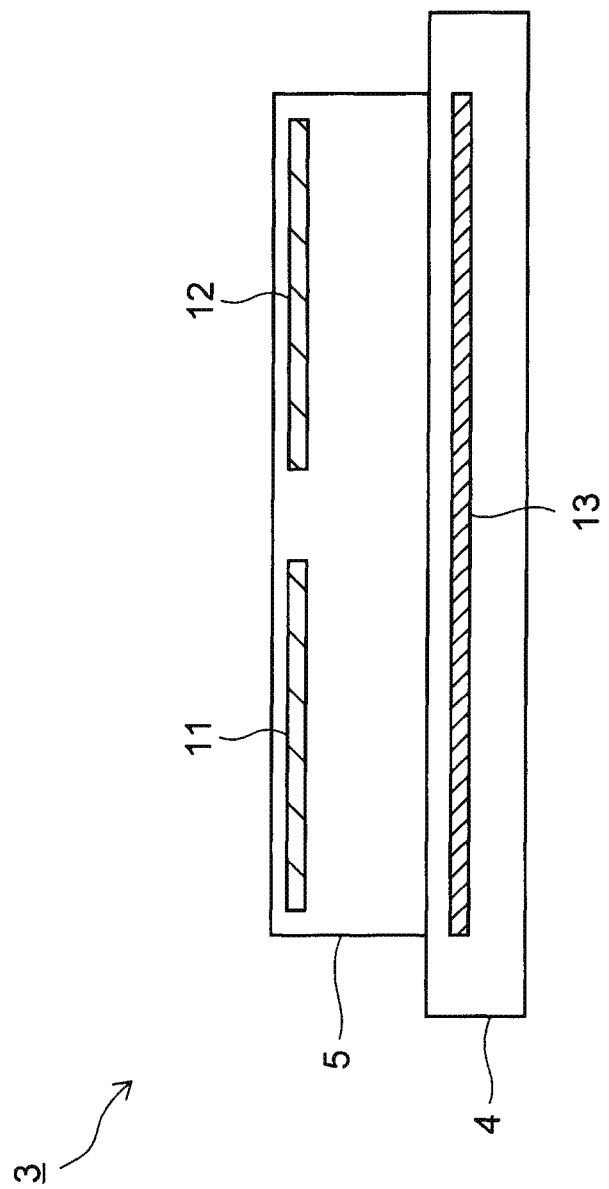
FIG. 13 is a sectional view of a substrate fixing device according to a second modification.

On the other hand, FIG. 13 is a sectional view of a substrate fixing device 3 according to a second modification.

In this example, a heater 13 is provided inside a base plate 4.

Also in any of the cases of FIGS. 12 and 13, it is possible to perform processes such as etching and CVD on a substrate S while heating the substrate S by the heater 13.

As described above, the exemplary embodiment and the modification are described in detail. However, the present invention is not limited to the above-described embodiment and the modification, and various modifications and replacements are applied to the above-described embodiment and the modifications without departing from the scope of claims.

What is claimed is:

1. An electrostatic chuck comprising:
   an insulating plate consisting of alumina, and YAG (Yttrium Aluminum Garnet) added with cerium, and configured to mount a substrate thereon; and
   an electrode which is embedded in the insulating plate and configured to generate electrostatic force for adsorbing the substrate,
   wherein a volume resistivity of the insulating plate is larger than $1\times10^{16}$ $\Omega\cdot$cm when a temperature of the insulating plate is 150° C.

2. The electrostatic chuck according to claim 1, wherein the insulating plate consists of crystal of the alumina, and crystal of the YAG added with the cerium.

3. The electrostatic chuck according to claim 1, wherein a concentration of the cerium is in a range of 0.4 mol % to 0.8 mol %.

4. A substrate fixing device comprising:
   an electrically conductive base plate; and
   an electrostatic chuck fixed on the base plate, wherein the electrostatic chuck comprises:
      an insulating plate consisting of alumina, and YAG (Yttrium Aluminum Garnet) added with cerium, and configured to mount a substrate thereon; and
      an electrode which is embedded in the insulating plate and configured to generate electrostatic force for adsorbing the substrate,
   wherein a volume resistivity of the insulating plate is larger than $1\times10^{16}$ $\Omega\cdot$cm when a temperature of the insulating plate is 150° C.

5. An electrostatic chuck comprising:
   an insulating plate comprising alumina, and YAG (Yttrium Aluminum Garnet) added with cerium, and configured to mount a substrate thereon; and
   an electrode which is embedded in the insulating plate and configured to generate electrostatic force for adsorbing the substrate,
   wherein a volume resistivity of the insulating plate is larger than $1\times10^{16}$ $\Omega\cdot$cm when a temperature of the insulating plate is 150° C.

* * * * *